US007539061B2

(12) United States Patent
Lee

(10) Patent No.: US 7,539,061 B2
(45) Date of Patent: May 26, 2009

(54) METHOD OF PROGRAMMING FLASH MEMORY DEVICE

(75) Inventor: Min Kyu Lee, Icheon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 366 days.

(21) Appl. No.: 11/557,343

(22) Filed: Nov. 7, 2006

(65) Prior Publication Data

US 2007/0263452 A1 Nov. 15, 2007

(30) Foreign Application Priority Data

May 10, 2006 (KR) .................. 10-2006-0041769

(51) Int. Cl.
*G11C 11/34* (2006.01)
(52) U.S. Cl. .................. 365/185.22; 365/185.17; 365/185.18
(58) Field of Classification Search ............ 365/185.22, 365/185.17, 185.18
See application file for complete search history.

(56) References Cited

U.S. PATENT DOCUMENTS

| 6,954,380 | B2 * | 10/2005 | Ono et al. ............... 365/185.24 |
| 7,447,086 | B2 * | 11/2008 | Wan et al. ............... 365/195 |
| 2005/0024938 | A1 * | 2/2005 | Ono et al. ............... 365/185.14 |
| 2005/0219896 | A1 | 10/2005 | Chen et al. |
| 2008/0316829 | A1 * | 12/2008 | Hemink ............... 365/185.17 |

FOREIGN PATENT DOCUMENTS

JP 09-091978 4/1997
KR 10-2005-0015853 2/2005
WO WO-2004/044917 5/2004

OTHER PUBLICATIONS

Cho et al., "A 3.3V 1Gb Multi-Level NAND Flash Memory with Non-Uniform Threshold Voltage Distribution," *IEEE J. of Solid-Satae Circuits Conf.*, Session 2, (2001).
Cho et al., "A Dual-Mode NAND Flash Memory: 1-Gb Multilevel and High-Performance 512-Mb Single-Level Modes," *IEEE J. of Solid-State Circuits*, 36:1700-1706 (2001).
Jung et al., "A 3.3V 128Mb Multi-Level NAND Flash Memory for Mass Storage Applications," *IEEE International Solid-Satae Circuits Conference*, Session 2 (1996).
Suh et al., "A 3.3V 32Mb NAND Flash Memory with Incremental Step Pulse Programming Scheme," *IEEE International Solid-State Circuits Conference*, Session 7 (1995).
Tomoharu et al., "A Quick Intelligent Page-Programming Architecture and a Shielded Bitline Sensing Method for 3 V-Only NAND Flash Memory," *IEEE J. of Solid-State Circuits*, 29:1366-1373 (1994).

* cited by examiner

*Primary Examiner*—Tuan T. Nguyen
(74) *Attorney, Agent, or Firm*—Marshall, Gerstein & Borun LLP

(57) ABSTRACT

At the time of a program of a NAND flash memory device, a re-program is performed on a cell connected to the last word line after program and program verification are completed. Thus, threshold voltage distributions of the cell connected to the last word line can be controlled to have a narrow width in the same manner as that of other cells. It is therefore possible to secure the read margin of a chip and to improve the yield. Accordingly, the durability and reliability of devices can be improved by threshold voltage distributions controlled to have a narrow width as described above.

15 Claims, 7 Drawing Sheets

METHOD OF PROGRAMMING FLASH MEMORY DEVICE

BACKGROUND

1. Technical Field

This patent relates, in general, to a method of programming a flash memory device and, more particularly, to a method of programming a flash memory device, in which threshold voltage distributions of a cell connected to the last word line can be controlled to have a narrow width.

2. Discussion of Related Art

In recent years, there is an increasing demand for semiconductor memory devices which can be electrically programmed and erased and does not require a refresh function of rewriting data at regular intervals. Furthermore, to develop memory devices with a large capacity capable of storing lots of data, a high-integrated technique of memory cells has been developed. To increase the integration of the memory cells, a NAND flash memory device in which a plurality of cells are connected in series to form one string and two strings share one contact has been developed.

The NAND flash memory device includes a plurality of cell blocks and a plurality of circuits for driving the cells. Each of the cell blocks includes a plurality of cell strings. FIG. 1 is a circuit diagram for illustrating a portion of a construction including a cell string.

Each of cell strings 101 and 102 includes a plurality of cells for storing data, which are connected in series. A drain select transistor 110 and a source select transistor 120 are formed between the cell strings 101 and 102 and a drain, and the cell strings 101 and 102 and a source, respectively. Furthermore, cells are connected to word lines WL0 to WL31. The drain select transistor 110 and the source select transistor 120 are connected to a drain select line DSL and a source select line SSL, respectively. The number of each of the cell strings 101 and 102 is the same as that of bit lines BL. Accordingly, the number of the drain select transistors 110 and the source select transistors 120 is also the same as that of bit lines BL.

Meanwhile, each cell includes a gate in which a tunnel oxide layer, a floating gate, a dielectric layer, and a control gate are laminated on a predetermined region of a semiconductor substrate. The cell also includes a junction region disposed at both sides of a gate.

In the NAND flash memory device constructed above, program and erase are performed by controlling a threshold voltage of the memory cell while injecting and discharging electrons into and from the floating gate by means of F-N tunneling. For example, in order to program a selected cell, a program voltage is applied to a selected word line WL using an ISPP method, a pass voltage of about 10 V is applied to an unselected word line WL, a ground voltage Vss is applied to a selected bit line BL, and a power supply voltage Vcc is applied to an unselected bit line BL. At this time, the drain select line DSL is applied with the power supply voltage Vcc, the source select line SSL is applied with the ground voltage Vss, the common source line CSL is applied with the power supply voltage Vcc, and a P well is applied with the ground voltage Vss.

Meanwhile, in the erase operation, electrons injected into the floating gate are removed by applying an erase voltage of about 20 V to a triple P well and 0 V to the entire word lines of a selected block. In this case, electrons are injected into the floating gate of a programmed cell. Accordingly, the programmed cell has a positive threshold voltage. To the contrary, electrons are discharged from the floating gate of an erased cell. Accordingly, the erased cell has a negative threshold voltage.

However, the performance of a device depending on an over-program problem and read margin depends on the distributions of threshold voltages of a program cell of a NAND flash memory device. The threshold voltage distributions of the program cell are controlled by applying a program voltage using the ISPP method. The cell threshold voltage distributions are a very important factor in a multi-level cell.

However, if program is performed using the ISPP method, the distributions of the cell threshold voltages can be controlled to a narrow width, but there occurs a difference in the cell threshold voltage within the cell string on a cell basis. This is caused by a Back Pattern Dependency (BPD) phenomenon and an interference phenomenon, but is not related to the characteristics inherent in the string cell. More particularly, cells connected to the word lines WL0 to WL30 from the source select line and cells connected to the word line WL 31 adjacent to the drain select line have a slight difference in the threshold voltage.

FIG. 2 is a graph showing the distributions of cell threshold voltages when the ISPP method is performed on a NAND flash memory device of 1 MB. In FIG. 2, "A" denotes threshold voltage distributions of a cell connected to the first word line WL0, "B" denotes threshold voltage distributions of a cell connected to the second word line WL1, "C" denotes threshold voltage distributions of a cell connected to the last word line WL31, and "D" denotes threshold voltage distributions of cells connected to word lines from the first word line WL0 to the last word line WL31.

As shown in FIG. 2, the cell connected to the last word line W31, which is programmed lastly, is not influenced by a threshold voltage distortion phenomenon of an access cell depending on threshold voltages of neighboring cells (i.e., an interference phenomenon), but has an initial cell threshold voltage. Accordingly, the cell decides the left cell distributions of cell threshold voltage distributions of a chip. A difference in the distributions is about 0.3 V in a single level cell and about 0.15 V in a multi-level cell.

The cell threshold voltage that is distributed widely as described above degrades the read margin of the single level cell or the multi-level cell and has a bad effect on the reliability of a device, such as a cycling characteristic and a retention characteristic.

SUMMARY OF THE INVENTION

Accordingly, this patent addresses the above problems, and discloses a method of programming a flash memory device, in which it can improve the reliability of a device by controlling threshold voltage distributions of a cell, which is connected to the last word line, to have a narrow width.

Furthermore, a method of programming a flash memory device, which can improve the reliability of a device by controlling threshold voltage distributions of a cell to have a narrow width in such a manner that re-program is performed on a cell connected to the last word line after program and program verification.

There is described a method of programming a flash memory device, including performing program and program verification on a selected memory cell, and if the programmed cell is a cell connected to a last word line, performing a re-program.

The program may be performed by applying a program voltage to a word line connected to the selected cell and a pass voltage to a word line connected to an unselected cell.

The program may be performed by applying a ground voltage to a bit line connected to the selected cell and a power supply voltage to a bit line connected to an unselected cell.

The program verification may be performed by applying a verify voltage to a word line connected to the selected cell and a power supply voltage to a word line not connected to the selected cell.

The verify voltage may be lower than the power supply voltage, preferably, 0 to 1 V.

The program verification may be performed by applying a voltage lower than the power supply voltage to a bit line connected to the selected cell and a ground voltage to a bit line connected to the unselected cell.

The re-program may be performed by applying a re-program voltage through the last word line and a power supply voltage through word lines other than the last word line.

The re-program voltage may be the same as or higher than a voltage at the time of the program verification, preferably, 1 to 1.5 V.

The re-program may be performed by applying a voltage to a bit line connected to the selected cell and a ground voltage to a bit line not connected to the selected cell.

The voltage applied to the bit line connected to the selected cell may be higher than the power supply voltage, preferably, 5 V.

The re-program may be performed for 150□ or less.

There is also described a method of programming a flash memory device, including performing a program by applying a program voltage through a word line of a selected cell, verifying a program status of the cell on which the program has been performed, repeatedly performing the program while increasing the program voltage of a cell that has not been programmed as a result of the verification and, and if the programmed cell is connected to a last word line as a result of the verification, performing a re-program by applying a re-program voltage through the last word line and a voltage through a bit line.

DETAILED DESCRIPTION OF EMBODIMENTS

Now, various embodiments will be described with reference to the accompanying drawings. Because various embodiments are provided for the purpose that the ordinary persons skilled in the art are able to understand the present patent, they may be modified in various manners and the scope of the present patent is not limited by the various embodiments described later.

Figure 1:
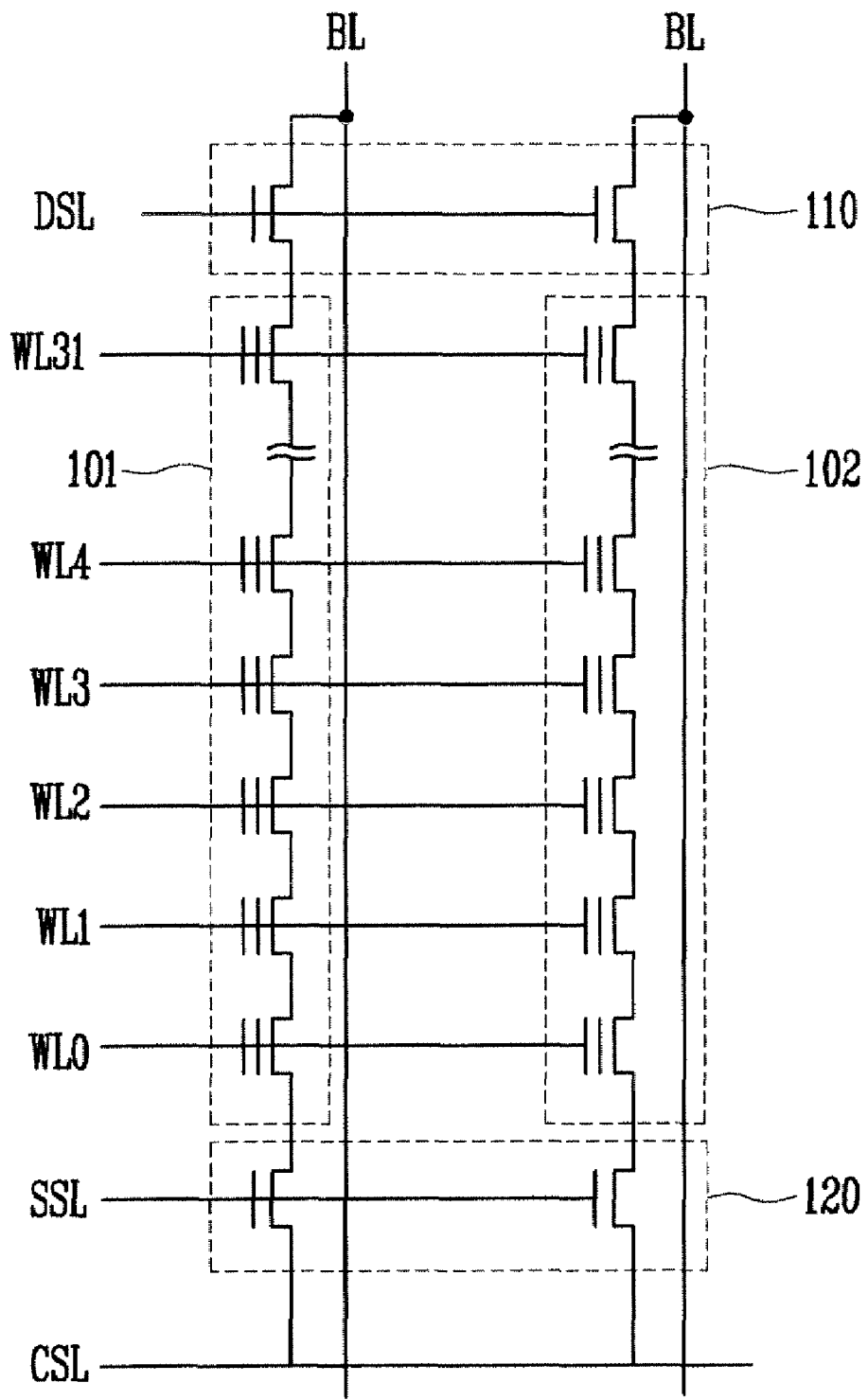
FIG. 1 is a schematic circuit diagram of a cell string of a general NAND flash memory device.
Figure 2:
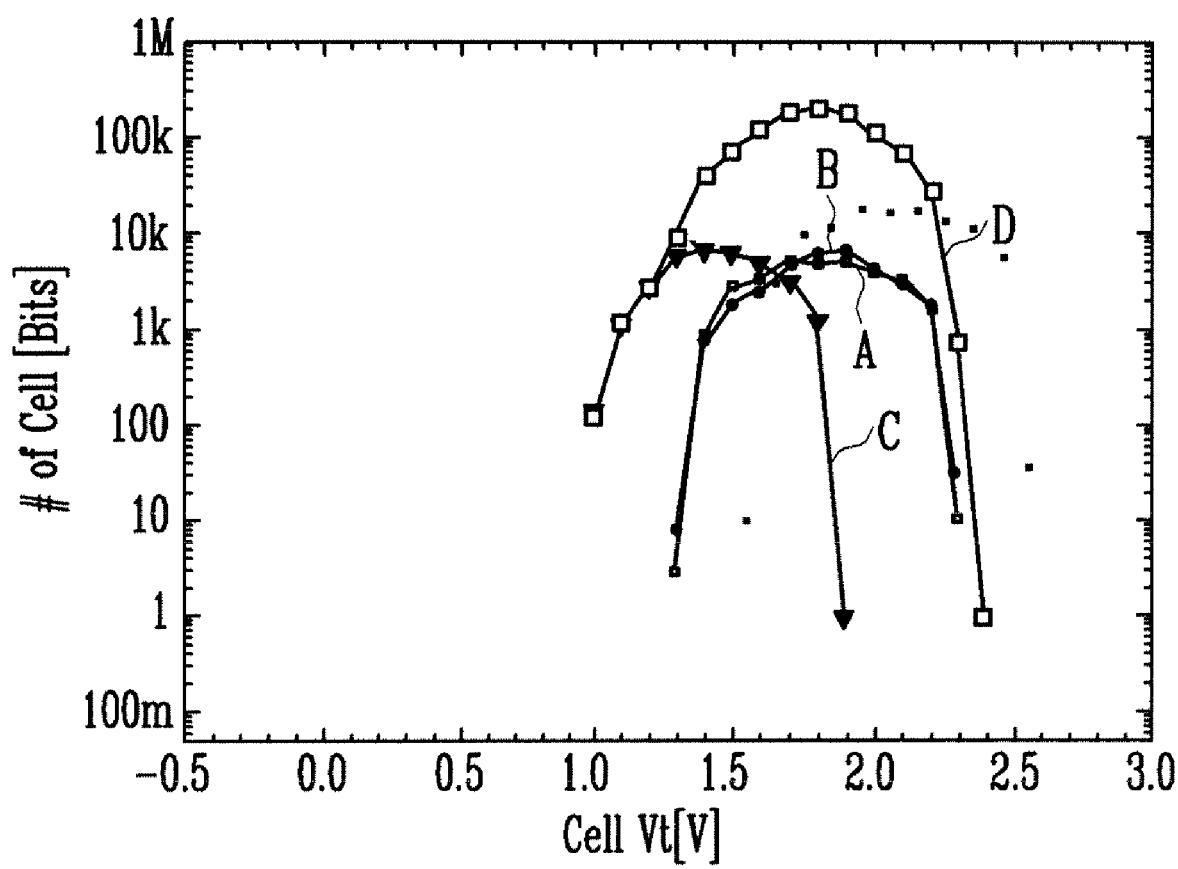
FIG. 2 is a graph showing the distributions of cell threshold voltages on a word line basis in a conventional program.
Figure 3:
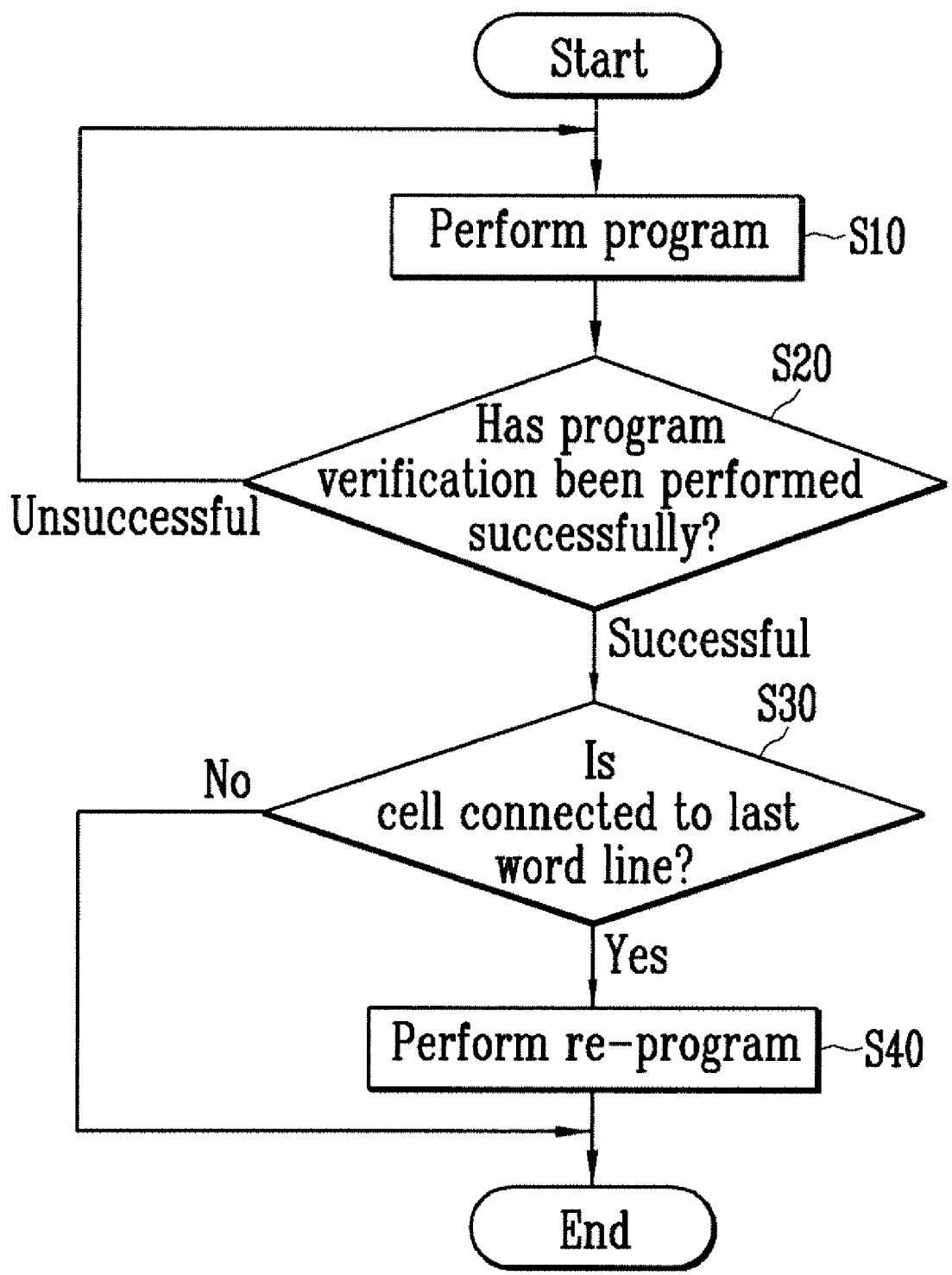
FIG. 3 is a flowchart illustrating a method of programming a flash memory device according to an embodiment of the present invention.
Figure 4:
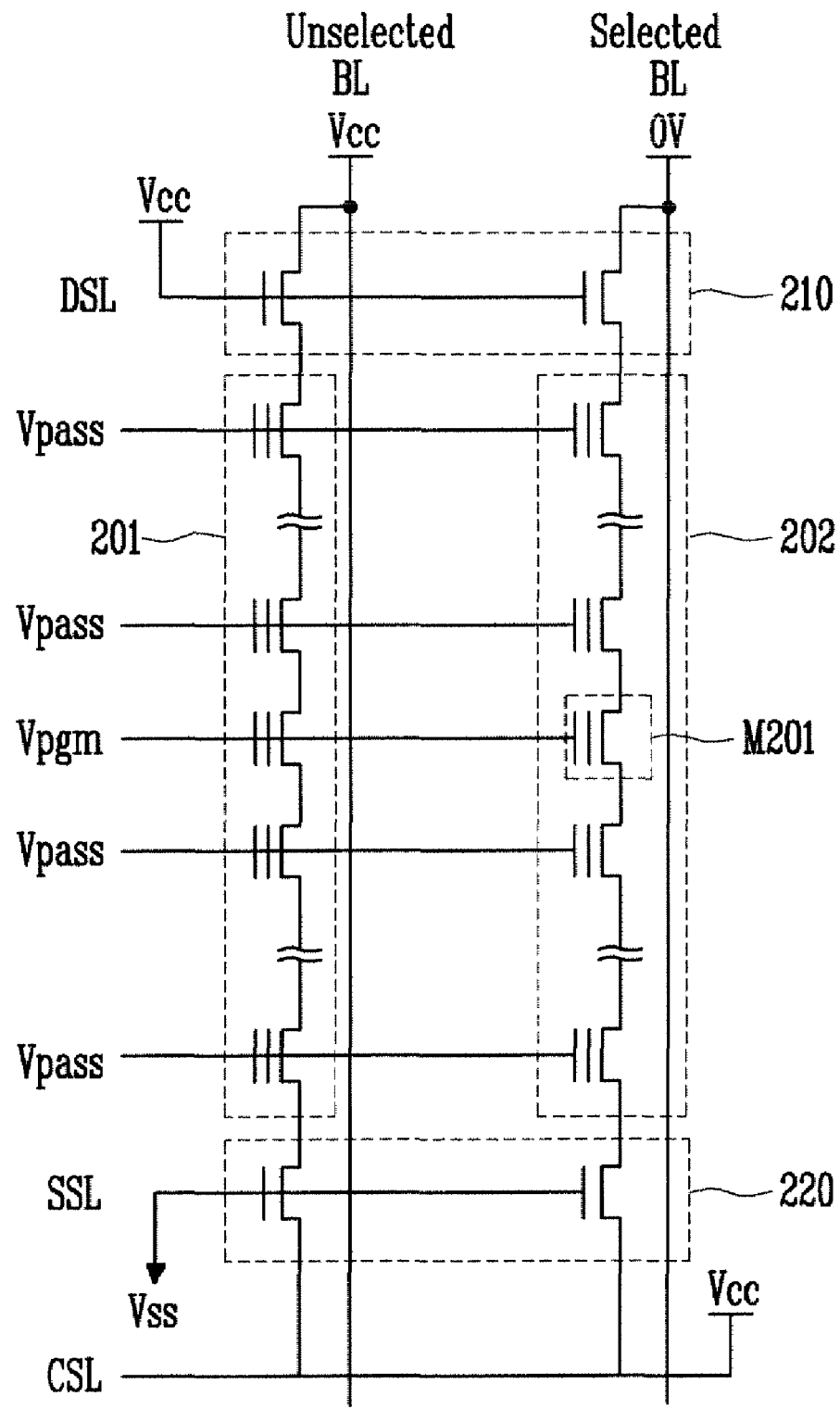
FIG. 4 is a schematic circuit diagram of a cell string for illustrating a bias condition at the time of a main program in the method of programming the flash memory device according to an embodiment of the present invention.
Figure 5:
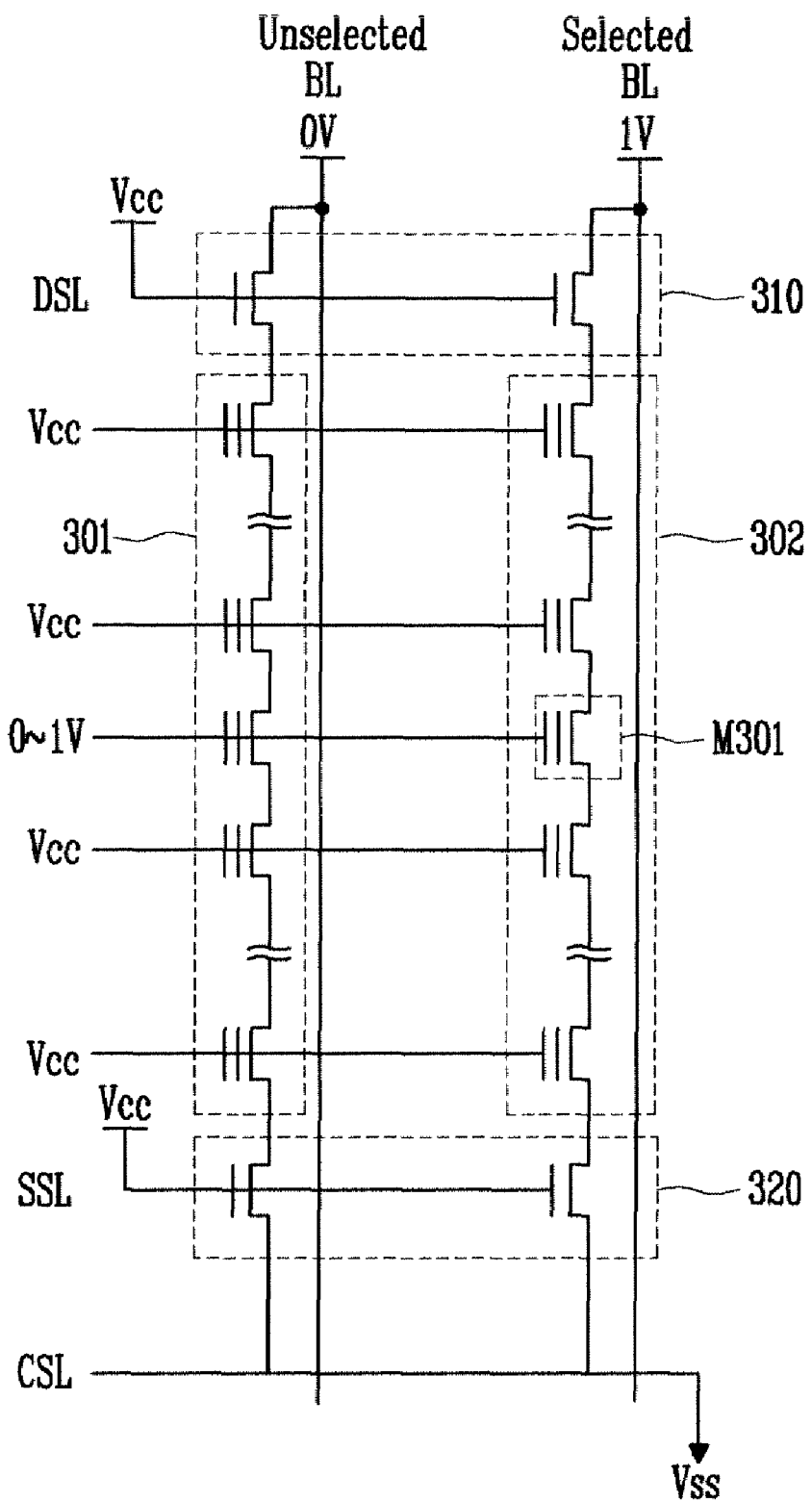
FIG. 5 is a schematic circuit diagram of a cell string for illustrating a bias condition at the time of program verification in the method of programming the flash memory device according to an embodiment of the present invention.
Figure 6:
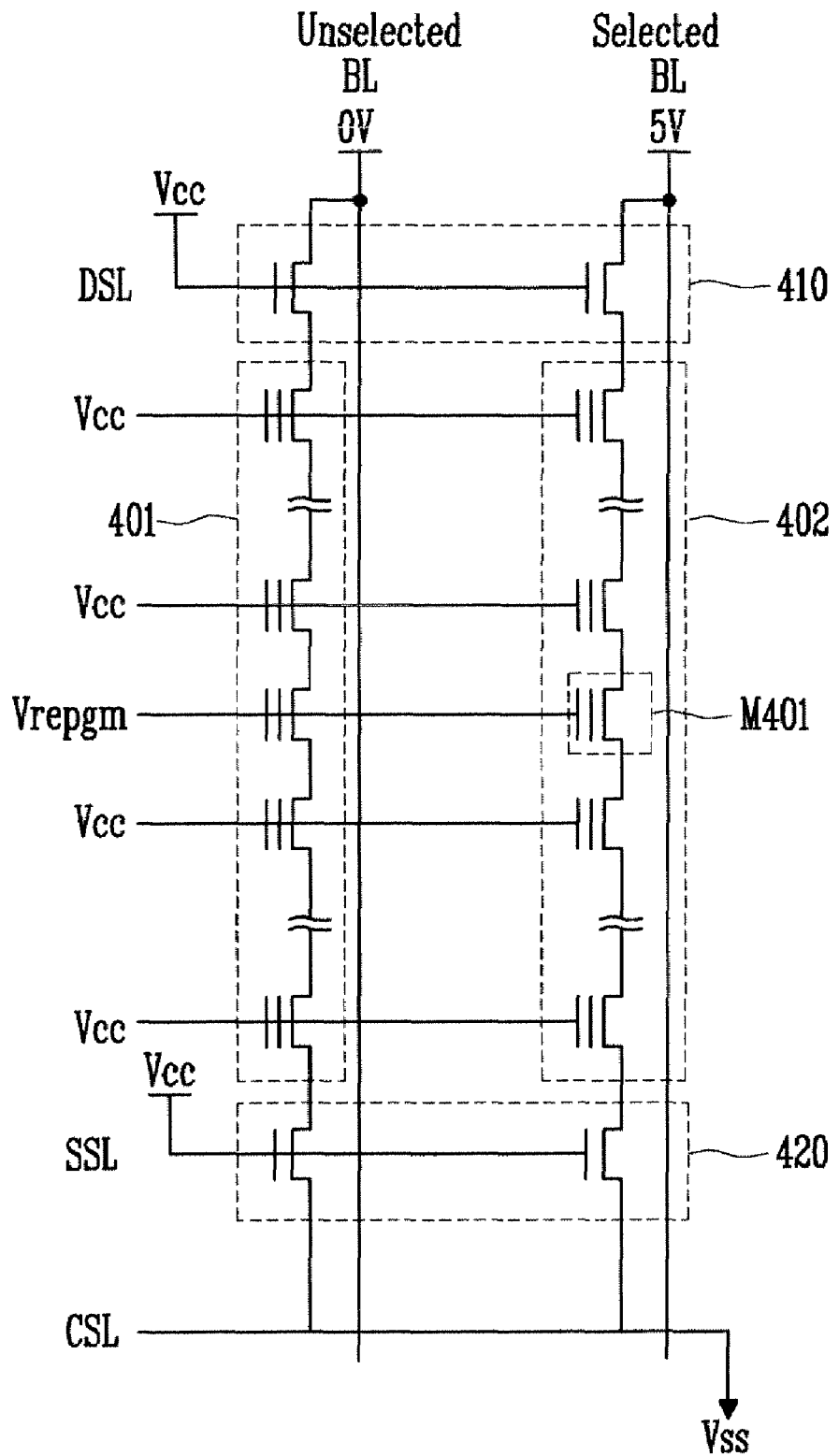
FIG. 6 is a schematic circuit diagram of a cell string for illustrating a bias condition at the time of re-program in the method of programming the flash memory device according to an embodiment of the present invention.

FIG. 3 is a flowchart illustrating a method of programming a flash memory device according to an embodiment of the present invention. FIGS. 4 to 6 are schematic circuit diagrams of cell strings for illustrating bias conditions at the time of a main program, program verification and re-program, respectively, in a method of programming a flash memory device according to an embodiment of the present invention. A method of programming a flash memory device according to an embodiment of the present invention will be described below with reference to FIGS. 4 to 6.

Referring to FIG. 3, a program is performed on a selected cell at S10. To program a selected cell M201, a selected word line WL is applied with a program voltage Vpgm, an unselected word line WL is applied with a pass voltage Vpass of about 10 V, a selected bit line BL is applied with a ground voltage Vss, and an unselected bit line BL is applied with a power supply voltage Vcc, as shown in FIG. 4. At this time, a drain select line DSL is applied with a power supply voltage Vcc, a source select line SSL is applied with the ground voltage Vss, a common source line CSL is applied with the power supply voltage Vcc, and a P well is applied with the ground voltage Vss.

After the program is performed on the selected cell, program verification is performed at S20. In order to perform program verification of a selected cell M301, a selected word lines WL is applied with a verify voltage of about 0 to 1 V, an unselected word line WL is applied with a power supply voltage Vcc, a selected bit line BL is applied with a voltage of about 1 V, and an unselected bit line BL is applied with a ground voltage Vss, as shown in FIG. 5. At this time, a drain select line DSL and a source select line SSL are applied with the power supply voltage Vcc, and a common source line CSL and a P well are applied with the ground voltage Vss.

If the program has not been performed successfully at S20, a program employing the ISPP method is performed again while increasing a program voltage at S10.

If the program has been performed successfully at S20, it is determined whether a cell is a cell connected to the last word line at S30.

If the cell is the cell connected to the last word line at S30, a re-program is performed at S40. To perform the re-program of a selected cell M401, a selected word line WL is applied with a re-program voltage Vrepgm, which is the same as or higher than a voltage at the time of verification, preferably, about 1 to 1.5 V, an unselected word line WI, is applied with a power supply voltage Vcc, a selected bit line BL is applied with a voltage, which is higher than the power supply voltage Vcc, preferably, a voltage of about 5 V, and an unselected bit line BL is applied with a ground voltage Vss, as shown in FIG. 6. At this time, the drain select line DSL and the source select line SSL are applied with the power supply voltage Vcc, and a common source line CSL and a P well are applied with the ground voltage Vss.

Meanwhile, the re-program is performed for about 150 μs or less. If so, hot carriers that have been generated at the corners of a channel are injected into the floating gate to supplement electrons, which lacks in the floating gate. Accordingly, since the cell has an increased threshold voltage, threshold voltage distributions of the cell become similar to that of other cells.

If the cell is not the cell connected to the last word line at S30, the program is finished.

Figure 7:
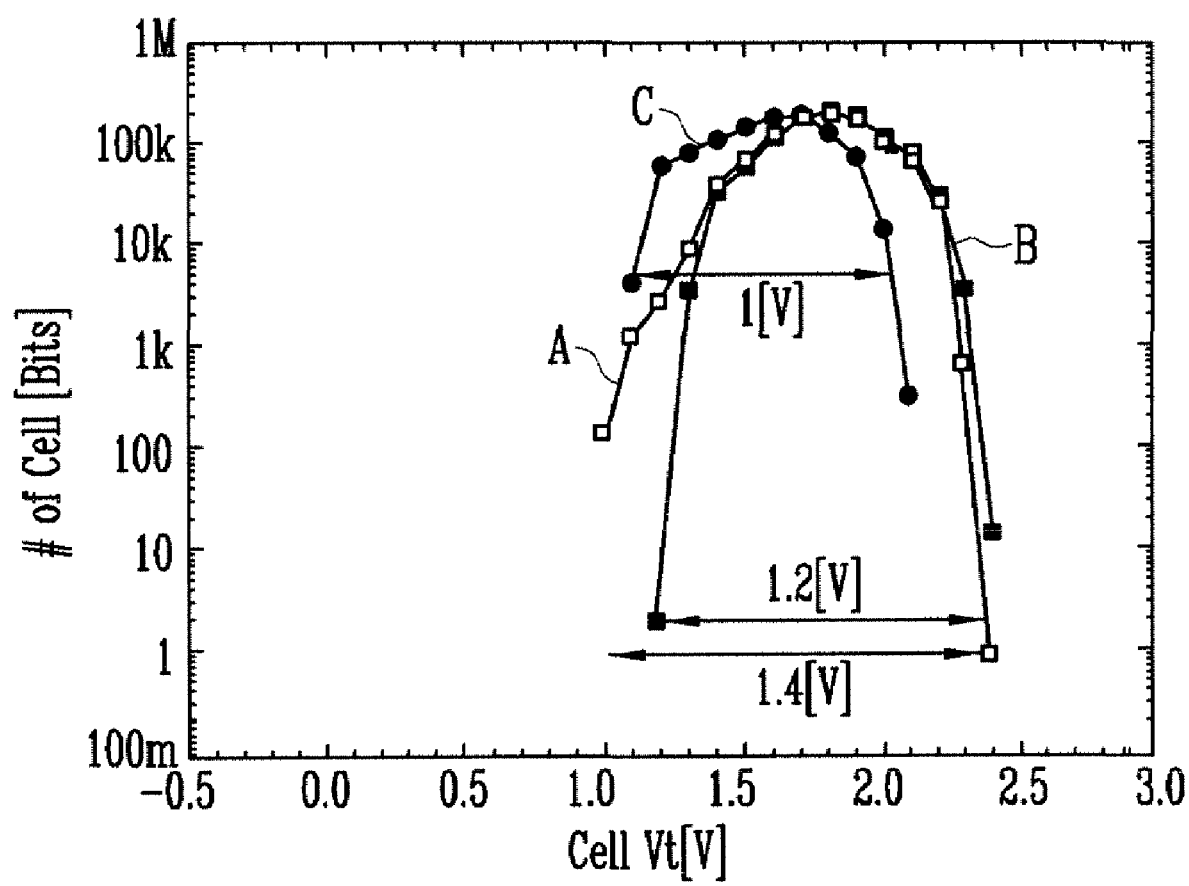
FIG. 7 is a graph shown to compare the distributions of threshold voltages of a program cell according to a conventional method and a method of the present invention.

FIG. 7 is a graph showing threshold voltage distributions A of a cell connected to the last word line when a program is performed using a conventional method and threshold voltage distributions B and C of a cell connected to the last word line according to an embodiment of the present invention.

From the graph "A", it can be seen that when a program is performed according to the conventional method, the threshold voltage distributions of the cell connected to the last word line have a width of 1.4 V. It can also be seen from the graph "B" that when a voltage of 1.2 V is applied at the time of re-program according to an embodiment of the present invention, the threshold voltage distributions of the cell connected to the last word line have a width of 1.2 V. Furthermore, it can be seen from the graph "C" that when a voltage of 1.1 V is applied at the time of re-program according to an embodiment of the present invention, the threshold voltage distributions of the cell connected to the last word line have a width of 1.0 V.

As described above, at the time of a program of a NAND flash memory device, a re-program may be performed on a cell connected to the last word line after program and program verification are completed. Therefore, threshold voltage distributions of the cell connected to the last word line can be controlled to have a narrow width in the same manner as that of other cells. It is therefore possible to secure the read margin of a chip and to improve the yield. Accordingly, the durability and reliability of devices can be improved by threshold voltage distributions controlled to have a narrow width as described above.

Although the foregoing description has been made with reference to the various embodiments, it is to be understood that changes and modifications of the present patent may be made by the ordinary skilled in the art without departing from the spirit and scope of the present patent and appended claims

What is claimed is:

1. A method of programming a flash memory device, comprising:
    performing program and program verification on a selected memory cell; and
    if the programmed cell is a cell connected to a last word line, performing a re-program.

2. The method of claim 1, wherein the program is performed by applying a program voltage to a word line connected to the selected cell and a pass voltage to a word line connected to an unselected cell.

3. The method of claim 1, wherein the program is performed by applying a ground voltage to a bit line connected to the selected cell and a power supply voltage to a bit line connected to an unselected cell.

4. The method of claim 1, wherein the program verification is performed by applying a verify voltage to a word line connected to the selected cell and a power supply voltage to a word line not connected to the selected cell.

5. The method of claim 4, wherein the program verification is performed by applying a voltage lower than the power supply voltage to a bit line connected to the selected cell and a ground voltage to a bit line connected to the unselected cell.

6. The method of claim 4, wherein the verify voltage is lower than the power supply voltage.

7. The method of claim 6, wherein the verify voltage is in the range of 0 to 1 V.

8. The method of claim 1, wherein the re-program is performed by applying a re-program voltage through the last word line and a power supply voltage through word lines other than the last word line.

9. The method of claim 8, wherein the re-program voltage is the same as or higher than a voltage at the time of the program verification.

10. The method of claim 8, wherein the re-program voltage is in the range of 1 to 1.5 V.

11. The method of claim 8, wherein the re-program is performed by applying a voltage to a bit line connected to the selected cell and a ground voltage to a bit line not connected to the selected cell.

12. The method of claim 11, wherein the voltage applied to the bit line connected to the selected cell is higher than the power supply voltage.

13. The method of claim 11, wherein the voltage applied to the bit line connected to the selected cell is 5 V.

14. The method of claim 1, wherein the re-program is performed for 150 μs or less.

15. A method of programming a flash memory device, comprising:
    performing a program by applying a program voltage through a word line of a selected cell;
    verifying a program status of the cell on which the program has been performed;
    repeatedly performing the program while increasing the program voltage of a cell that has not been programmed as a result of the verification; and
    if the programmed cell is connected to a last word line as a result of the verification, performing a re-program by applying a re-program voltage through the last word line and a voltage through a bit line.

* * * * *